(12) United States Patent
Yuan et al.

(10) Patent No.: US 9,292,647 B2
(45) Date of Patent: Mar. 22, 2016

(54) METHOD AND APPARATUS FOR MODIFIED CELL ARCHITECTURE AND THE RESULTING DEVICE

(71) Applicant: GLOBALFOUNDRIES Inc., Grand Cayman (KY)

(72) Inventors: Lei Yuan, Cupertino, CA (US); Mahbub Rashed, Cupertino, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 34 days.

(21) Appl. No.: 14/163,511

(22) Filed: Jan. 24, 2014

(65) Prior Publication Data

US 2015/0213184 A1 Jul. 30, 2015

(51) Int. Cl.
*G06F 17/50* (2006.01)

(52) U.S. Cl.
CPC .................................. *G06F 17/5077* (2013.01)

(58) Field of Classification Search
USPC ......................................................... 716/129
See application file for complete search history.

(56) References Cited

U.S. PATENT DOCUMENTS

| | | | |
|---|---|---|---|
| 2008/0028352 A1* | 1/2008 | Birch et al. | ...................... 716/12 |
| 2010/0287518 A1* | 11/2010 | Becker | ............................. 716/9 |
| 2011/0014786 A1 | 1/2011 | Sezginer et al. | |
| 2012/0135600 A1* | 5/2012 | Lin et al. | ........................ 438/667 |
| 2014/0024209 A1 | 1/2014 | Jung et al. | |
| 2014/0264894 A1* | 9/2014 | Tien et al. | ..................... 257/773 |
| 2014/0320627 A1 | 10/2014 | Miyamoto et al. | |

FOREIGN PATENT DOCUMENTS

| | | |
|---|---|---|
| TW | 201334029 A | 8/2013 |
| TW | 201346983 A | 11/2013 |

OTHER PUBLICATIONS

Taiwanese Office Action for related Taiwanese Patent Application No. 103126540 dated Jul. 31, 2015, 7 Pages.

* cited by examiner

*Primary Examiner* — Paul Dinh
*Assistant Examiner* — Bryce Aisaka
(74) *Attorney, Agent, or Firm* — Ditthavong & Steiner, P.C.

(57) ABSTRACT

A methodology for a modified cell architecture and the resulting devices are disclosed. Embodiments may include determining a first vertical track spacing for a plurality of first routes for an integrated circuit (IC) design, each of the plurality of first routes having a first width, determining a second vertical track spacing for a second route for the IC design, the second route having a second width, and designating a cell vertical dimension for the IC design based on the first and second vertical track spacings.

18 Claims, 6 Drawing Sheets

METHOD AND APPARATUS FOR MODIFIED CELL ARCHITECTURE AND THE RESULTING DEVICE

TECHNICAL FIELD

The present disclosure relates to cell sizing in semiconductor layouts. The present disclosure is particularly applicable to cell architectures for self-aligned double patterning (SADP) at 10 nanometers (nm) technology nodes and beyond.

BACKGROUND

Desired device dimensions and pitches have decreased to the point where traditional single patterning photolithographic techniques (e.g., 193 nm wavelength photolithography) cannot form a single patterned mask layer with all of the features of the final target pattern. Thus, device designers and manufacturers have begun utilizing various double patterning techniques requiring multiple exposures to define a single target pattern. Two such techniques are lithography-etch-lithography-etch (LELE) and SADP. The two techniques are similar in the sense that both involve splitting a single overall target circuit pattern into two, less dense, target patterns. The two, less dense, target patterns are printed separately using two interlocking patterning masks. For example, a second patterning mask is utilized to print features that interlock with the features patterned by a first patterning mask. SADP has better overlay control than LELE and thus provides a more viable solution for 10 nm route technology and beyond.

In order to create the interlocking first and second patterning masks, design rules must first ensure that the overall target pattern is decomposable. As used herein, the term "decomposable" may be used to refer to the overall target pattern's adherence to various design rules governing the spacing and dimensions of individual device features. Sophisticated electronic design automation (EDA) tools may be used to ensure, for example, that adjacent features are assigned to the same or different patterning mask depending on the distance between the features. The design rules ensure that the overall target pattern is faithfully reproduced by assigning the individual features (based on their spacing and dimensions) to the appropriate patterning mask.

In SADP, a metal wire that is defined by a mandrel pattern is called mandrel metal. A metal wire that is not defined a mandrel pattern is called non-mandrel metal. In design terminology, mandrel metal and non-mandrel metal may be referred to as "different color" metals whereas mandrel metals or non-mandrel metals are respectively referred to as "same color" metals. Design rules enforcing minimum separation distances between metals are applied to mandrel metals and non-mandrel metals separately. For example, mandrel metal to mandrel metal distance is checked by a same color design rule. Similarly, non-mandrel metal to non-mandrel metal distance is checked by a same color design rule. On the other hand, mandrel metal to non-mandrel metal separation distance need be checked by a different color design rule.

SADP imposes restrictions on designers because it requires adherence to a more complex set of design rules. This is especially problematic for dense high-speed cell designs where designers must be able to flexibly design the power routing features. For example, the width of second metal (M2) power rails located adjacent to non-power M2 routes (also referred to as "M2 metal routes" or "M2 layer metal routes") is greatly restricted for a cell design. For example, in conventional 9-track cell architecture, an M2 power rail that is larger than the default metal width will cost four M2 route tracks due to the restrictive SADP design rule, which causes a significant degradation of chip scaling. Thus, circuit designers are unable to flexibly adjust the width of M2 power rails based on specific electro-migration (EM) and IR drop requirements for a circuit. Although reference will be made to M2 metals, it is contemplated that the disclosure herein is also applicable to other layer metals.

A need therefore exists for methodology for a modified cell architecture that allows flexibly varying the width of metal power rails in double-patterning processes, and the resulting device while maintaining the routing efficiency.

SUMMARY

An aspect of the present disclosure is a cell architecture with a modified cell height that is not defined purely as an integer multiple of a track or metal pitch.

Another aspect of the present disclosure is a re-sized power rails that occupies a top or bottom track within a cell.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a first vertical track spacing for a plurality of first routes for an integrated circuit (IC) design, each of the plurality of first routes having a first width, determining a second vertical track spacing for a second route for the IC design, the second route having a second width, and designating a cell vertical dimension for the IC design based on the first and second vertical track spacings.

Aspects of the present disclosure include initiating a placement of the plurality of first routes extending horizontally in the cell and each of the plurality of first routes being placed on one of a plurality of equally spaced vertical track positions of the cell with the first vertical track spacing. Additional aspects include initiating a placement of the second route extending horizontally in the cell and being placed on a top or bottom vertical track position of the cell. Further aspects include the top and bottom vertical track positions being spaced from the plurality of equally spaced vertical track positions by the second vertical track spacing, and a separation distance between the second route and an adjacent first route of the plurality of first routes being equal to the separation distance between two adjacent first routes of the plurality of first routes. Additional aspects include determining the first width based on a minimum metal width of a double patterning process. Further aspects include determining the first vertical track spacing based on a minimum M2 pitch of the double patterning process. Additional aspects include the cell vertical dimension not being equal to an integer multiple of the minimum M2 pitch. Further aspects include determining the second width based on an EM and IR-drop effect and designating the second route as a power or ground rail for the IC design. Additional aspects include designating a plurality of cells in the IC design, each of the cells having the designated cell vertical dimension and including: the plurality of first routes extending horizontally and each being placed on one of the plurality of equally spaced vertical track positions of the cell with the first vertical track spacing, and the second route extending horizontally and being placed on a top or bottom vertical track position of the cell. Further aspects include at least one of the cells including the second route having the second width, extending horizontally in the cell and being placed on a top or bottom vertical track position of the IC design. Additional aspects include the at least one of the cells further including a third route having the second width, extending horizontally in the IC design and being placed on the top or bottom vertical track position of the IC design, the second and third routes being positioned at opposite boundaries of the cell.

Another aspect of the present disclosure is an apparatus including at least one processor, at least one memory including computer program code for one or more programs, the at least one memory and the computer program code configured to, with the at least one processor, cause the apparatus to perform at least the following: determine a first vertical track spacing for a plurality of first routes for an IC design, each of the plurality of first routes having a first width, determine a second vertical track spacing for a second route for the IC design, the second route having a second width, and designate a cell vertical dimension for the IC design based on the first and second vertical track spacings.

Aspects include the apparatus being further caused to initiate a placement of the plurality of first routes extending horizontally in the cell and each being placed on one of a plurality of equally spaced vertical track positions of the cell with the first vertical track spacing. Additional aspects include the apparatus being caused to initiate a placement of the second route extending horizontally in the cell and being placed on a top or bottom vertical track position of the cell. Further aspects include the top and bottom vertical track positions being spaced from the plurality of equally spaced vertical track positions by the second vertical track spacing, and a separation distance between the second route and an adjacent first route of the plurality of first routes being equal to the separation distance between two adjacent first routes of the plurality of first routes. Additional aspects include the apparatus being caused to determine the first width based on a minimum metal width of a double patterning process. Further aspects include the apparatus being caused to determine the first vertical track spacing based on a minimum M2 pitch of the double patterning process. Additional aspects include the cell vertical dimension not being equal to an integer multiple of the minimum M2 pitch. Further aspects include the apparatus being caused to determine the second width based on an EM and IR-drop effect, and designate the second route as a power or ground rail for the IC design. Additional aspects include the apparatus being caused to designate a plurality of cells in the IC design, each of the cells having the designated cell vertical dimension and including: the plurality of first routes extending horizontally and each being placed on one of the plurality of equally spaced vertical track positions of the cell with the first vertical track spacing, and the second route extending horizontally and being placed on a top or bottom vertical track position of the cell. Further aspects include at least one of the cells including the second route having the second width, extending horizontally in the cell and being placed on a top or bottom vertical track position of the IC design. Additional aspects include the at least one of the cells further including a third route having the second width, extending horizontally in the IC design and being placed on the top or bottom vertical track position of the IC design. Further aspects include the second and third routes being positioned at opposite boundaries of the cell.

Another aspect of the present disclosure is a method including: determining a first vertical track spacing for a plurality of first routes for an IC design, each of the plurality of first routes having a first width, determining a second vertical track spacing for a second route for the IC design, the second route having a second width, designating a cell vertical dimension for the IC design based on the first and second vertical track spacings, initiating a placement of the plurality of first routes extending horizontally in the cell and each being placed on one of a plurality of equally spaced vertical track positions of the cell with the first vertical track spacing, initiating a placement of the second route extending horizontally in the cell and being placed on a top or bottom vertical track position of the cell, determining the first width based on a minimum metal width of a double patterning process, determining the second width based on an EM and IR-drop effect, and designating the second route as a power or ground rail for the IC design.

Aspects include the at least one of the cells further including a third route having the second width, extending horizontally in the IC design and being placed on the top or bottom vertical track position of the IC design, the second and third routes being positioned at opposite boundaries of the cell.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
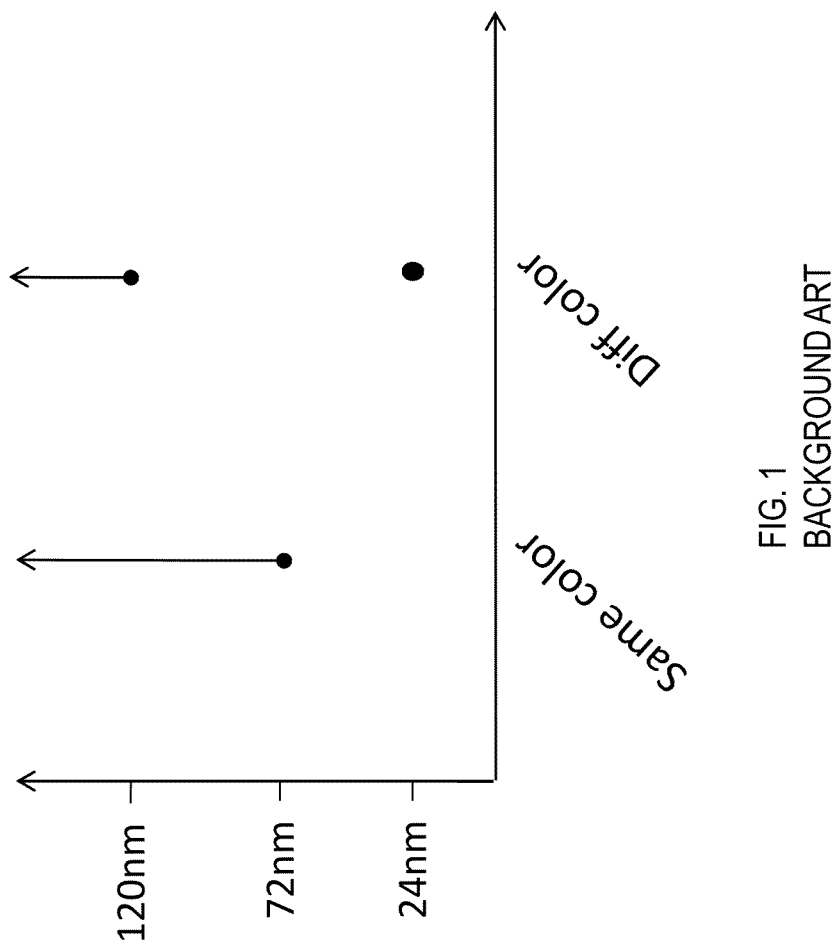
FIG. 1 illustrates the restrictions on the spacing of adjacent metal routes for an SADP process.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of constrained power rail width affecting an SADP process for 10 nm technology nodes and beyond. In accordance with embodiments of the present disclosure, a cell height is modified to accommodate wide power rails.

Methodology in accordance with embodiments of the present disclosure includes: determining a first vertical track spacing for a plurality of first routes for an IC design, each of the plurality of first routes having a first width, determining a second vertical track spacing for a second route for the IC design, the second route having a second width, and designating a cell vertical dimension for the IC design based on the first and second vertical track spacings.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

For any circuit layout to be formed using double patterning techniques (e.g., LELE, SADP), the layout must be checked to confirm that it can be decomposed into two separate, interlocking, patterning masks. Mask engineers utilize sophisticated EDA tools to confirm the geometry of groups of adjacent circuit features and to determine if grouped features are decomposable. To determine if a layout is compliant, the EDA tools are utilized to connect adjacent features in a polygon loop connecting the centroids of the features. A circuit layout must have zero odd-cycles to be decomposable. Depending on its length, an edge may be assigned to a single patterning mask (also referred to as a "same color" edge) or different patterning masks (also referred to as "different color" edge). In certain instances, the layout may not be decomposable because an odd number of features have been assigned to two patterning masks. To remedy this, the EDA tool may increase the distance between a pair of adjacent features to trigger a different set of mask assignments and, thereby, reduce the number of features assigned to two patterning masks to an even number. Thus, SADP requires zero number of odd edges per polygon for proper decomposition.

FIG. 1 illustrates the spacing requirements of a conventional SADP process with a default metal width of 24 nm. As indicated, the minimum spacing between two "same color" metals must be at least 72 nm. The minimum spacing may be determined as a sum (72 nm) of the width (24 nm) of an intervening "different color" metal and the spacing (2×24 nm) between each of the "same color" metals and the intervening "different color" metal. As further indicated, the spacing between two, adjacent, "different color" metals is 24 nm. The minimum spacing between two, non-adjacent, "different color" metals is 120 nm, determined as the sum of three inter-metal spacings (3×24 nm) and two metal widths (2×24 nm).

Figure 2:
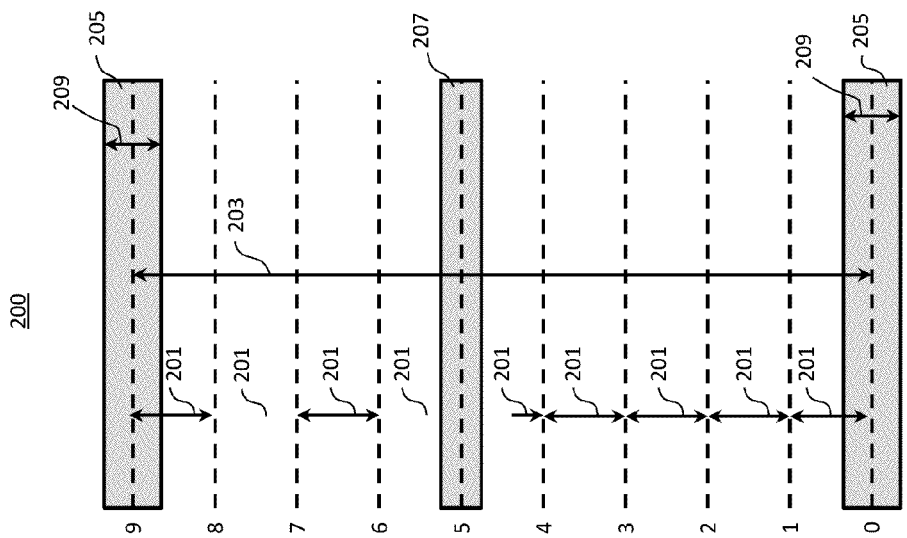
FIG. 2 illustrates an M2 gridding for a conventional cell.

FIG. 2 illustrates an M2 gridding 200 for a conventional cell. Although the gridding 200 is illustrated for a 9-track cell, it is contemplated that the discussion may be applied to any cell size. The tracks are numbered 0 through 9. The vertical track spacing 201 is equal to a metal pitch of the SADP process. As all the tracks of the gridding 200 are equally spaced, the cell height 203 is equal to an integer multiple of the vertical track spacing 201. For example, assuming a track spacing of 48 nm, the cell height 203 is equal to 9×48, or 432 nm.

Typically, the top and bottom tracks are used for power routing and the inner tracks are used for metal routing. For instance, tracks 0 and 9 may provide gridding for power rails 205 (e.g., Vss, Vdd) and metal route 207 may be placed on any of tracks 1 through 8. Half of each of the power rails 205 lies in an adjacent cell (not shown for illustrative convenience) above and below tracks 9 and 0, respectively. If the width of power rails 205 is larger than the default metal width, metal routes may not be placed on tracks 1 and 8 because they would violate the minimum spacing requirements rule.

Figure 3B:
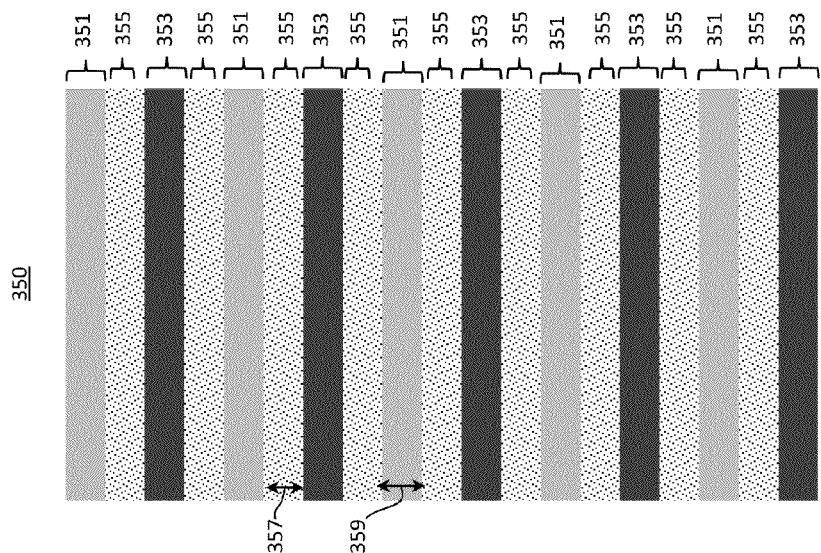
FIG. 3B schematically illustrates an M2 layer formed by a SADP process according to the gridding in FIG. 3A.
Figure 3A:
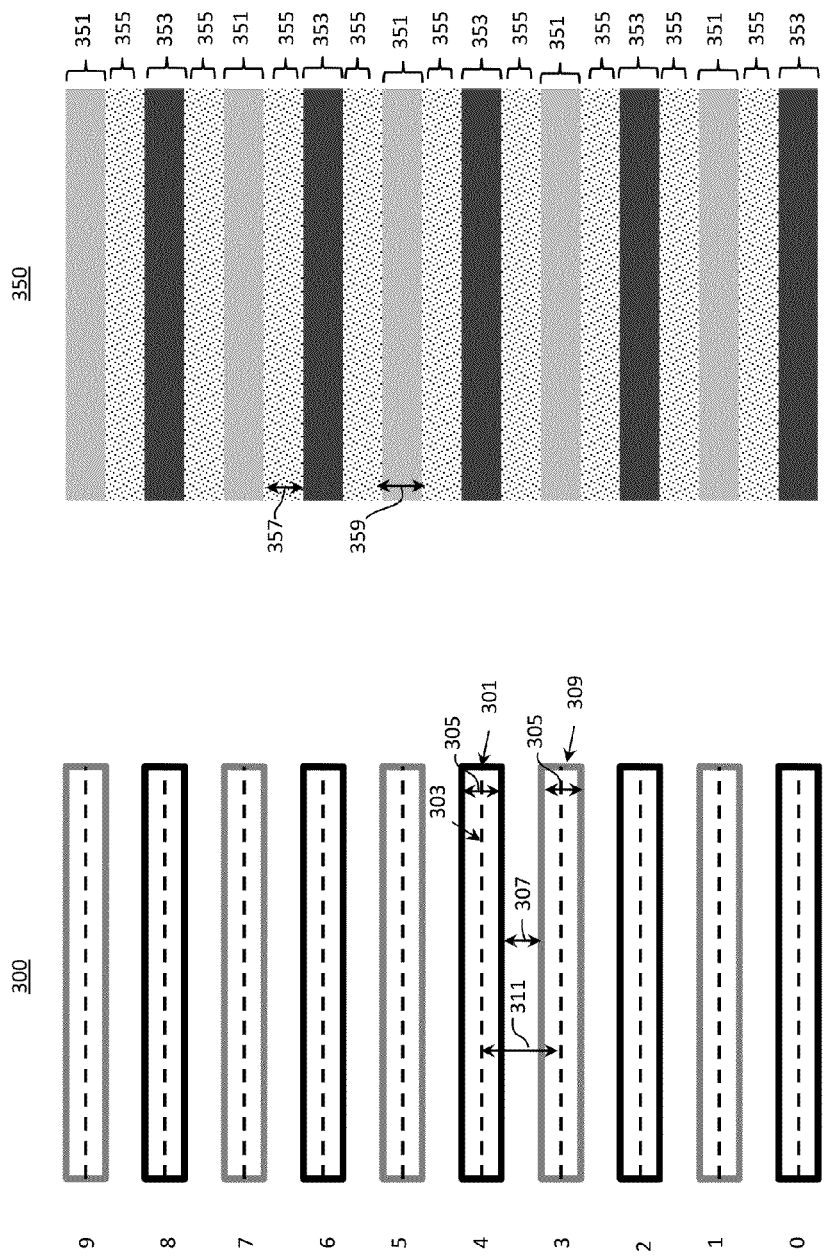
FIG. 3A illustrates an M2 route placement for a conventional gridding.

FIGS. 3A and 3B illustrate a conventional cell formed according to an SADP process. FIG. 3A illustrates a metal route placement on a gridding 300. As shown, each of the metal routes (e.g., metal route 301) is placed at the vertical track position (e.g., track 303) such that half the metal width 305 lies on each side of the track. To avoid process issues, the separation distance 307 between adjacent metal routes is typically set to be equal to the metal width 305. The vertical track spacing 309 is equal to the sum of the separation distance 307 and the metal width 305. For example, the vertical track spacing 309 is equal to 48 nm for a separation distance 307 of 24 nm and a metal width 305 of 24 nm.

FIG. 3B schematically illustrates a metal layer 350 formed by an SADP process, according to the gridding 300 in FIG. 3A. Metal routes formed by a first mandrel mask are interleaved with non-mandrel metal routes formed by a block or trim mask. The metal routes formed by a particular patterning mask may be referred to as "same color" metals. For example, mandrel metal routes 351 may be designated as "red" color metal routes and non-mandrel metal routes 353 may be designated as "blue" color metal routes. Each of the spacers 355 between the metal routes has a width 357 corresponding to the required separation distance (e.g., separation distance 307 in FIG. 3A). Each of the metal routes has a metal width 359 corresponding to the default metal width of the SADP process (e.g., metal width 305 in FIG. 3A).

Figure 4:
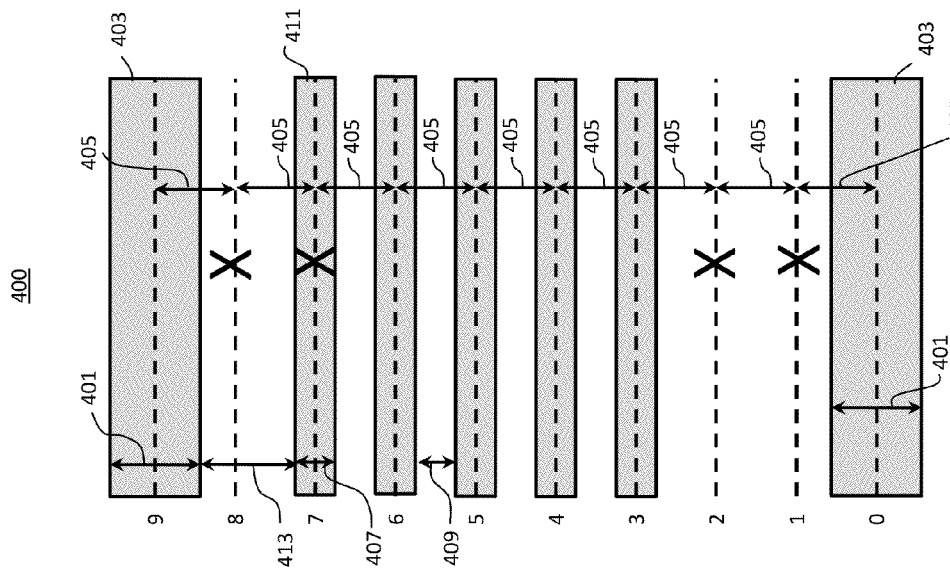
FIG. 4 illustrates an M2 route placement with wide M2 power rails of a conventional cell for an SADP process.

FIG. 4 illustrates a placement of wide M2 power rails on a conventional gridding 400. The width 401 of the M2 power rails 403 on tracks 0 and 9 is greater than a default metal width for the SADP process. Therefore, metal routes may not be placed on adjacent tracks 1 and 8 to comply with the minimum separation distance requirement for "different color" metals, as illustrated in FIG. 1. In addition, tracks 2 and 7 may also not be used for metal route placement to comply with the minimum separation distance requirement for "same color" metals, as also illustrated in FIG. 1. Assuming a vertical track spacing 405 of 48 nm and a default metal width 407 of 24 nm, the spacing 409 between adjacent metal routes must either be equal to 24 nm, or larger than or equal to 72 nm as shown in FIG. 1. Assuming a metal route 411 is placed on track 7, the spacing 413 (between metal route 411 and the power rail 403 on track 9) is neither equal to 24 nm nor larger than 72 nm. Thus, metal route 411 cannot be manufactured by the SADP process. The loss of tracks 1, 2, 7, and 8 significantly degrades routing in cell designs with wide power rails.

Figure 5:
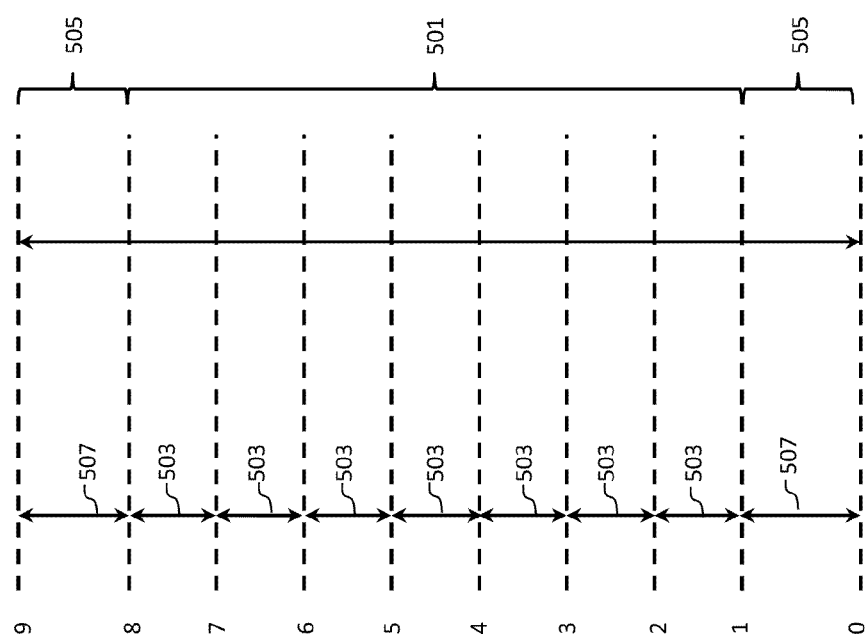
FIG. 5 illustrates a gridding for a modified cell architecture, in accordance with an exemplary embodiment of the present disclosure.

FIG. 5 illustrates a gridding 500 for a modified cell architecture, in accordance with an exemplary embodiment of the present disclosure. The gridding 500 may be divided into a first portion 501 with a vertical track spacing 503 and a second portion 505 with a vertical track spacing 507. The vertical track spacing 503 is set to the default or minimum metal pitch P1 for the double patterning process. The vertical track spacing 507 may be varied based on a desired width for a power rail on tracks 0 and 9. For instance, the vertical track spacing 507 may be increased to accommodate the wide M2 power rail while maintaining the minimum separation distance between a metal route on track 1 or 8 and the power rail on track 0 or 9, respectively. The value of the vertical track spacing 507 (P2) may be determined by:

$$P2 = \frac{1}{2} \times (W - W1) + P1 \quad (1)$$

where W is a desired M2 power rail width and W1 is the default metal width of the double patterning process.

Figure 6B:
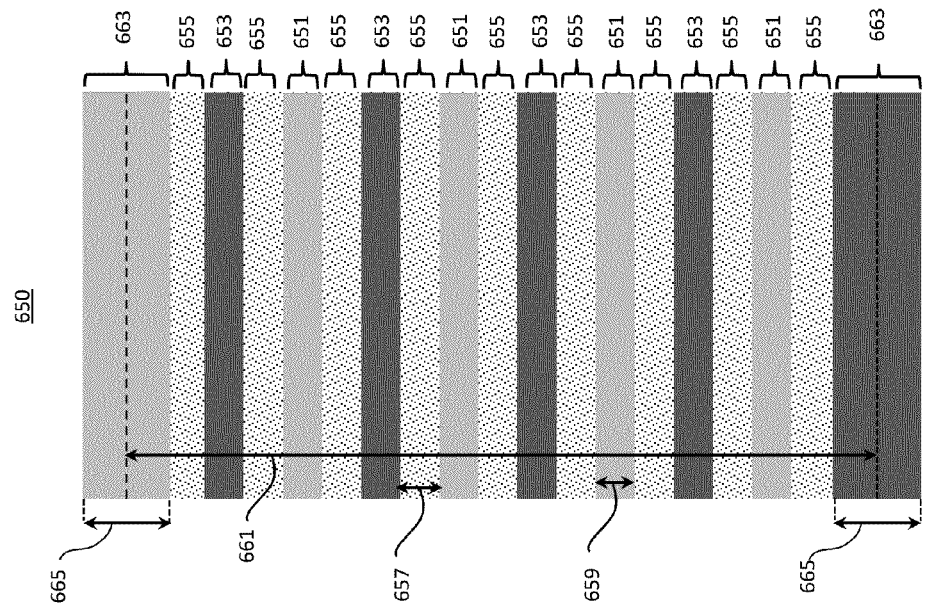
FIG. 6B schematically illustrates an M2 layer formed by an SADP process for a cell with modified height, in accordance with an exemplary embodiment.
Figure 6A:
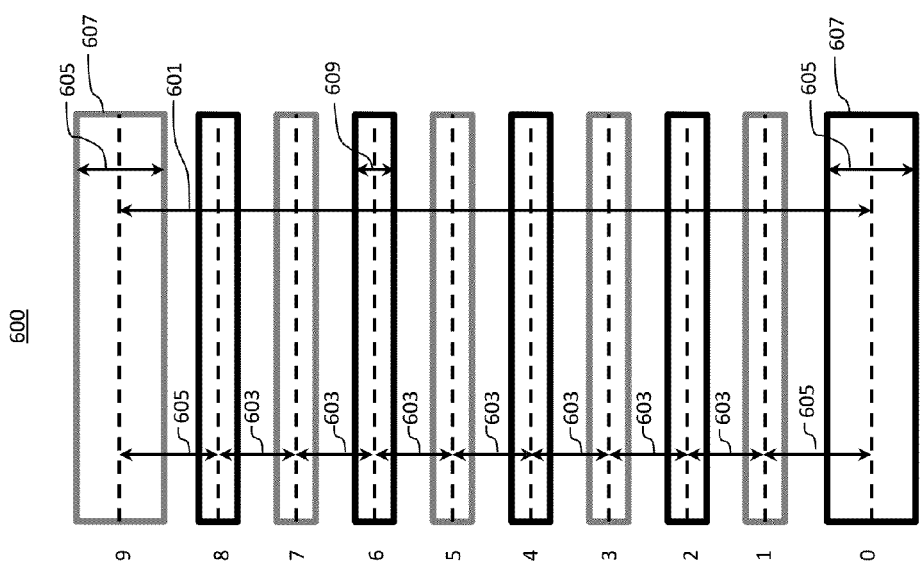
FIG. 6A illustrates an M2 route placement on a gridding for a cell with a modified height, in accordance with an exemplary embodiment.

FIGS. 6A and 6B illustrate a modified cell architecture formed by an SADP process, in accordance with an exemplary embodiment of the present disclosure. FIG. 6A illustrates a metal route placement on a gridding 600 for a cell with a modified height, in accordance with an exemplary embodiment. The modified cell height 601 (H) is given by:

$$H = (X-2) \times P1 + 2 \times P2 \quad (2)$$

where X is the number of tracks in the cell, P1 is the default or minimum M2 pitch 603 (corresponding to the vertical track spacing 503 in FIG. 5) of the SADP process, and P2 is the M2 pitch (corresponding to the vertical track spacing 507 in FIG. 5) for a wide power rail on tracks 0 and 9 and a metal route on tracks 1 and 8, respectively.

For example, an SADP process may have a default metal width (W1) of 24 nm and a minimum metal pitch (P1) of 48 nm. According to Equation (1), to accommodate a power rail width (W) of 54 nm in a nine-track cell (X=9), the metal pitch P2 (corresponding to the vertical track spacing 507 in FIG. 5) must equal 63 nm. Using Equation (2), the cell height is equal to 462 nm.

The additional height of the cell beyond a conventional cell height is obtained by subtracting X×P1 from H and comes to:

$$2 \times (P2 - P1) \quad (3)$$

The additional cell height is obtained more simply by subtracting the default metal width from the width of the widened power rails, or:

$$W - W1 \quad (4)$$

Thus, for example, the additional height for a cell with metal pitch for the metal routes of 48 nm, a power rail width of 54 nm and a default metal width of 24 nm is equal to 462–432, or 30 nm.

FIG. 6B illustrates a metal layer 650 formed by an SADP process according to the gridding 600. The term "red" colors is used to describe metals 651 formed by a mandrel mask while the term "blue" colors is used to describe metals 653 not formed by a mandrel mask. Each of the spacers 655 has a width 657 that allows for the separation distance between adjacent features required by the SADP process. The metal width 659 corresponds to the default metal width of the SADP process.

The cell height 661 accommodates the wide M2 power rails 663 while allowing all the intervening tracks 1 through 8 of the gridding 600 in FIG. 6A to be utilized. The width 657 of the spacers 655 corresponds to the minimum spacing required for adjacent features. The width 665 of the wide power rails 663 may be chosen according to an IR specification for an IC. For example, a designer may estimate the width based on an average or maximum current density and IR drop for supplying power to the IC. Equation (3) may then be used to obtain the required cell height. In addition to providing excellent electrical performance, the modified cell architecture allows designers to fully utilize all intervening tracks.

The embodiments of the present disclosure can achieve several technical effects, including ease of cell design because of better metal routability and improved electrical performance because of the wider power rails. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 10 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A computer-implemented method comprising steps of:
   determining a first vertical track spacing for a plurality of first routes for an integrated circuit (IC) design, each of the plurality of first routes having a first width;
   determining a second vertical track spacing for a second route for the IC design, the second route having a second width;
   determining the first width based on a minimum metal width of a double patterning process;
   determining the first vertical track spacing based on a minimum second metal (M2) pitch of the double patterning process; and
   designating a cell vertical dimension for the IC design based on the first and second vertical track spacings,
   wherein the cell vertical dimension is not equal to an integer multiple of the minimum M2 pitch, and
   the steps are performed by at least one processor.

2. The method according to claim 1, further comprising:
   initiating a placement of the plurality of first routes extending horizontally in the cell and each being placed on one of a plurality of equally spaced vertical track positions of the cell with the first vertical track spacing.

3. The method according to claim 2, further comprising:
   initiating a placement of the second route extending horizontally in the cell and being placed on a top or bottom vertical track position of the cell.

4. The method according to claim 3, wherein the top and bottom vertical track positions are spaced from the plurality of equally spaced vertical track positions by the second vertical track spacing, and wherein a separation distance between the second route and an adjacent first route of the plurality of first routes is equal to the separation distance between two adjacent first routes of the plurality of first routes.

5. The method according to claim 1, further comprising:
   determining the second width based on an electro-migration (EM) and IR-drop effect; and
   designating the second route as a power or ground rail for the IC design.

6. The method according to claim 1, further comprising:
   designating a plurality of cells in the IC design, each of the cells having the designated cell vertical dimension and comprising:

the plurality of first routes extending horizontally and each being placed on one of the plurality of equally spaced vertical track positions of the cell with the first vertical track spacing; and the second route extending horizontally and being placed on a top or bottom vertical track position of the cell.

7. The method according to claim 6, wherein at least one of the cells comprises the second route having the second width, extending horizontally in the cell and being placed on a top or bottom vertical track position of the IC design.

8. The method according to claim 7, wherein the at least one of the cells further comprises:
a third route having the second width, extending horizontally in the IC design and being placed on the top or bottom vertical track position of the IC design,
wherein the second and third routes are positioned at opposite boundaries of the cell.

9. An apparatus comprising:
at least one processor; and
at least one memory including computer program code for one or more programs,
the at least one memory and the computer program code configured to, with the at least one processor, cause the apparatus to perform at least the following,
determine a first vertical track spacing for a plurality of first routes for an integrated circuit (IC) design, each of the plurality of first routes having a first width;
determine a second vertical track spacing for a second route for the IC design, the second route having a second width;
determine the first width based on a minimum metal width of a double patterning process;
determine the first vertical track spacing based on a minimum second metal (M2) pitch of the double patterning process; and
designate a cell vertical dimension for the IC design based on the first and second vertical track spacings,
wherein the cell vertical dimension is not equal to an integer multiple of the minimum M2 pitch.

10. The apparatus according to claim 9, wherein the apparatus is further caused to:
initiate a placement of the plurality of first routes extending horizontally in the cell and each being placed on one of a plurality of equally spaced vertical track positions of the cell with the first vertical track spacing.

11. The apparatus according to claim 10, wherein the apparatus is further caused to:
initiate a placement of the second route extending horizontally in the cell and being placed on a top or bottom vertical track position of the cell.

12. The apparatus according to claim 11, wherein the top and bottom vertical track positions are spaced from the plurality of equally spaced vertical track positions by the second vertical track spacing, and wherein a separation distance between the second route and an adjacent first route of the plurality of first routes is equal to the separation distance between two adjacent first routes of the plurality of first routes.

13. The apparatus according to claim 9, wherein the apparatus is further caused to:
determine the second width based on an electro-migration (EM) and IR-drop effect; and designate the second route as a power or ground rail for the IC design.

14. The apparatus according to claim 9, wherein the apparatus is further caused to:
designate a plurality of cells in the IC design, each of the cells having the designated cell vertical dimension and comprising:
the plurality of first routes extending horizontally and each being placed on one of the plurality of equally spaced vertical track positions of the cell with the first vertical track spacing; and
the second route extending horizontally and being placed on a top or bottom vertical track position of the cell.

15. The apparatus according to claim 9, wherein at least one of the cells comprises the second route having the second width, extending horizontally in the cell and being placed on a top or bottom vertical track position of the IC design.

16. The apparatus according to claim 15, wherein the at least one of the cells further comprises:
a third route having the second width, extending horizontally in the IC design and being placed on the top or bottom vertical track position of the IC design,
wherein the second and third routes are positioned at opposite boundaries of the cell.

17. A computer-implemented method comprising steps of:
determining a first vertical track spacing for a plurality of first routes for an integrated circuit (IC) design, each of the plurality of first routes having a first width;
determining a second vertical track spacing for a second route for the IC design, the second route having a second width;
designating a cell vertical dimension for the IC design based on the first and second vertical track spacings;
initiating a placement of the plurality of first routes extending horizontally in the cell and each being placed on one of a plurality of equally spaced vertical track positions of the cell with the first vertical track spacing;
initiating a placement of the second route extending horizontally in the cell and being placed on a top or bottom vertical track position of the cell;
determining the first width based on a minimum metal width of a double patterning process;
determining the second width based on an electro-migration (EM) and IR-drop effect;
determine the first vertical track spacing based on a minimum second metal (M2) pitch of the double patterning process; and
designating the second route as a power or ground rail for the IC design,
wherein the steps are performed by one or more processors, and
wherein the cell vertical dimension is not equal to an integer multiple of the minimum M2 pitch.

18. The method according to claim 17, wherein the at least one of the cells further comprises:
a third route having the second width, extending horizontally in the IC design and being placed on the top or bottom vertical track position of the IC design,
wherein the second and third routes are positioned at opposite boundaries of the cell.

* * * * *